(12) United States Patent
Okada

(10) Patent No.: US 6,348,720 B1
(45) Date of Patent: Feb. 19, 2002

(54) SOLID STATE IMAGE SENSING DEVICE AND METHOD OF MANUFACTURING THE SAME

(75) Inventor: Yoshihiro Okada, Hashima (JP)

(73) Assignee: Sanyo Electric Co., Ltd. (JP)

( * ) Notice: Subject to any disclaimer, the term of this patent is extended or adjusted under 35 U.S.C. 154(b) by 0 days.

(21) Appl. No.: 09/189,323

(22) Filed: Nov. 9, 1998

(30) Foreign Application Priority Data

Nov. 14, 1997 (JP) ................................................ 9-313730

(51) Int. Cl.[7] ...................... H01L 31/0232; H01L 29/78
(52) U.S. Cl. ......................... 257/437; 257/225; 257/229
(58) Field of Search ................................ 257/437, 225, 257/229

(56) References Cited

U.S. PATENT DOCUMENTS 4,742,027 A * 5/1988 Blanchard .................... 257/229
5,334,867 A * 8/1994 Shin ............................. 257/222
6,147,390 A * 11/2000 Nakano ....................... 257/437

* cited by examiner

Primary Examiner—Jerome Jackson, Jr.
(74) Attorney, Agent, or Firm—Fish & Richardson P.C.

(57) ABSTRACT

A solid state image sensing device formed on a substrate includes a transfer electrode having a first layer of polychrystalline silicon and a second layer of silicon nitride. The silicon nitride layer has a higher refractive index than an interlayer insulation film formed of silicon oxide, which allows light of shorter wavelengths, such as blue light, to reach light receiving pixels beyond the transfer electrode. The image sensing device has an improved sensitivity to shorter wavelength light.

4 Claims, 5 Drawing Sheets

SOLID STATE IMAGE SENSING DEVICE AND METHOD OF MANUFACTURING THE SAME

BACKGROUND OF THE INVENTION

The present invention relates to a solid-state image sensing device, and more particularly, to a CCD (charge coupled device) solid-state image sensing device employing a frame transfer system.

FIG. 1 is a schematic block diagram of a conventional CCD solid-state image sensing device 100 employing a frame transfer system. The CCD solid-state image sensing device 100 includes an image sensing part 102, a storage part 104, a horizontal transfer part 106 and an output part 108. The image sensing part 102 comprises a plurality of shift-registers (not shown) that extend in the vertical direction and are disposed parallel with each other. The shift-registers each comprise a plurality of register bits that correspond to light-receiving pixels. The storage part 104 comprises a plurality of light-blocked shift-registers (not shown) disposed adjoining the shift-registers of the image sensing part 102. Each of the storage part shift-registers comprises a plurality of register bits that form storage pixels. The horizontal transfer part 106 comprises a single shift-register (not shown) disposed extending in the horizontal direction. The transfer part shift-register comprises a plurality of shift-register bits connected with a plurality of shift-register outputs of the storage part 104, respectively. The output part 108 comprises capacitors for temporarily storing charges transferred from the horizontal transfer part 106 and reset-transistors for discharging the capacitors.

The light-receiving pixel register bits of the image sensing part 102 are transferred to the storage pixels of the storage part 104. The storage pixel bits stored in the storage part 104 are then transferred to the horizontal transfer part 106 in a unit of one line. The pixel data is then transferred from the horizontal transfer part 106 to the output part 108 in a unit of one pixel. A voltage that corresponds to each of the register bits is generated by the output part 108 and is output from the CCD solid-state image sensing device 100.

FIG. 2 is a schematic plan view of the image sensing part 102 which is a three phase driving type. FIG. 3A is a cross-sectional view along line 3A—3A of FIG. 2 and FIG. 3B is a cross-sectional view along line 3B—3B of FIG. 2.

A device area formed of a P-type diffusion region 2 is formed on a principal surface of an N-type silicon substrate 1. A plurality of thick channel isolation regions 3 formed by selective oxidation are disposed parallel with each other on the surface of the diffusion region 2. A plurality of N-type diffusion regions 4 are disposed between each of the channel isolation regions 3. The diffusion regions 4 are channel regions that are used as transfer paths by pixel data bits. Thin gate insulation films 5, which preferably comprise silicon dioxide films, are disposed integrally with the channel isolation regions 3 on the diffusion regions 4. A plurality of transfer electrodes 6, which preferably comprise polycrystalline silicon, are disposed parallel with each other in a direction that is perpendicular to the channel isolation regions 3. The transfer electrodes 6 are separated from each other by a constant distance on the gate insulation films 5 and the channel isolation regions 3. In order to control the potential of the channel region (diffusion regions 4), for example, in the case of three electrodes making one set, three phase transfer clocks φ1–φ3 are applied to the transfer electrodes 6. An interlayer insulation film 7 having the same composition as the gate insulation films 5 covers the transfer electrodes 6.

In a solid-state image sensing device employing a frame transfer system, light-receiving pixels are formed in the channel regions covered by the transfer electrodes 6. Since the light-receiving pixels are covered by the transfer electrodes 6, light reaches a photoelectric transfer area (the channel region) through the transfer electrodes 6. Generally, polycrystalline silicon, which forms the transfer electrodes 6, has high absorptance and reflectance for shorter wavelength light. Therefore, polycrystalline silicon passes little light of shorter wavelength and thus decreases the amount of such shorter wavelength light reaching the light-receiving pixels. This deteriorates the sensitivity of the light-receiving pixels for blue light (for example light having a wavelength from 4000 Å to 5000 Å).

Accordingly, it is an objective of the present invention to provide a solid-state image sensing device that includes light-receiving pixels that have an improved sensitivity to shorter wavelength light.

SUMMARY OF THE INVENTION

To achieve the foregoing and other objectives and in accordance with the purpose of the present invention, a solid state image sensing device is provided. The device includes a semiconductor substrate, a gate insulation film and a plurality of transfer electrodes. The semiconductor substrate has a plurality of channel regions extending in a first direction. The channel regions extend substantially parallel to each other with a predetermined spacing therebetween. The gate insulation film is located on a part of the semiconductor substrate that includes the channel regions. The transfer electrodes are formed on the gate insulation film and extend substantially parallel to each other in a second direction to intersect with the channel regions. Each transfer electrode includes a polycrystalline silicon layer disposed on the gate insulating film and a silicon nitride layer disposed on the polycrystalline silicon layer.

The present invention may also be applied to a method of manufacturing a solid state image sensing device. The method includes the steps of: forming a plurality of isolation regions extending substantially parallel to each other on a semiconductor substrate and forming a channel region between adjacent isolation regions; depositing a gate insulation film on the semiconductor substrate for covering the channel regions; depositing a polycrystalline silicon layer and a silicon nitride layer on the gate insulation film and patterning the polycrystalline silicon layer and the silicon nitride layer for forming a plurality of transfer electrodes intersecting with the isolation regions; and forming an inter-layer insulation film covering the transfer electrodes.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 1:
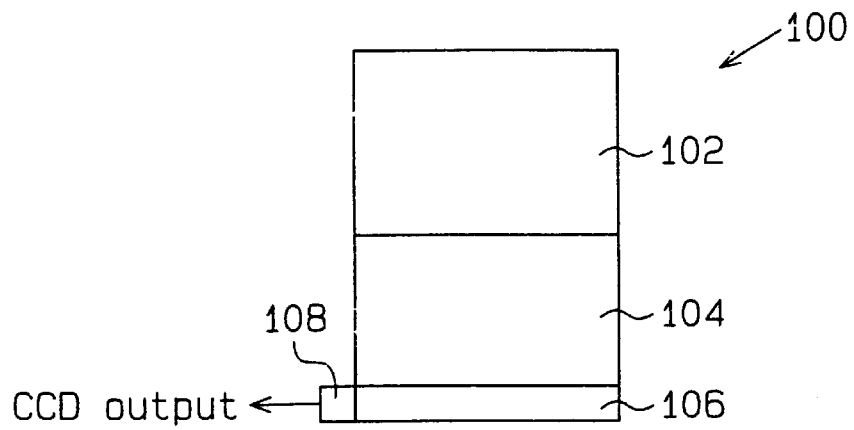
FIG. 1 is a schematic block diagram showing a conventional solid-state image sensing device of a frame transfer system.
Figure 2:
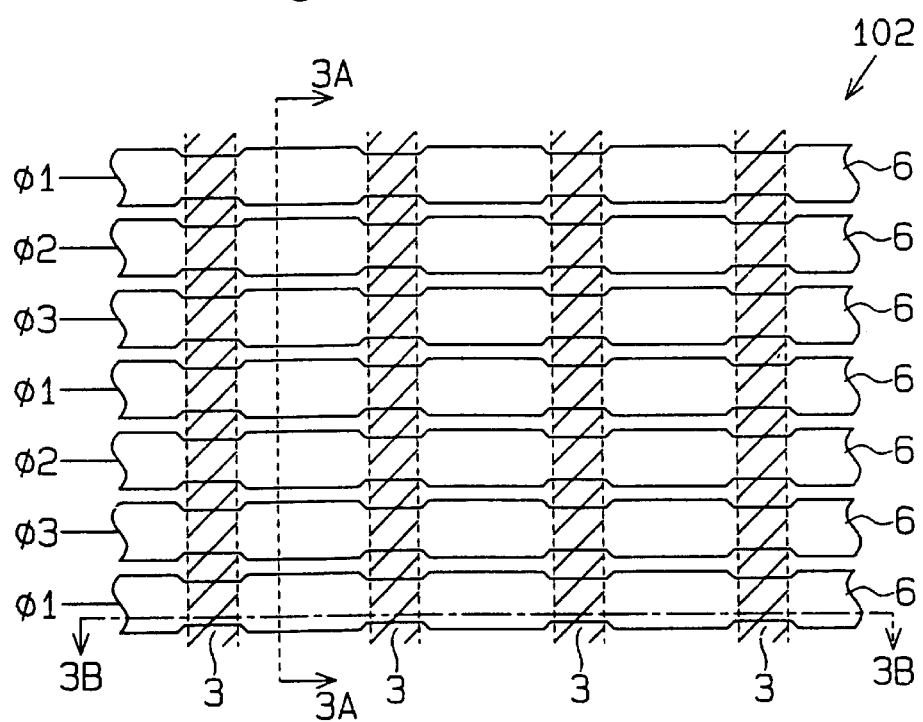
FIG. 2 is a schematic partial plan view of an image sensing part of the solid-state image sensing device of FIG. 1.
Figure 3A:
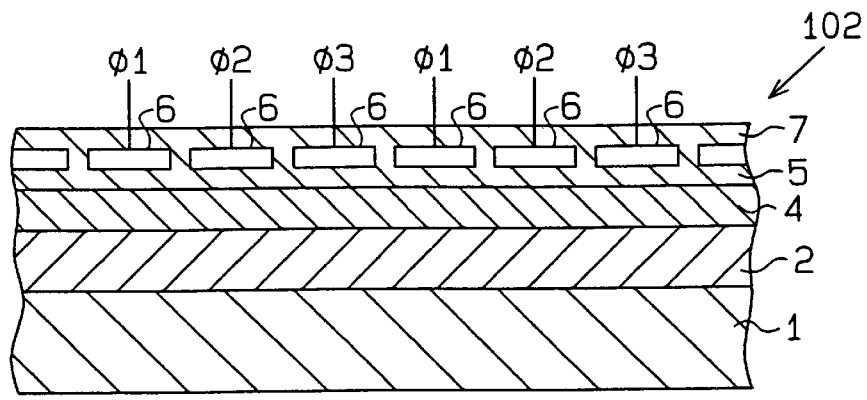
FIG. 3A is a cross-sectional view of the image sensing part along line 3A—3A of FIG. 2.
Figure 3B:
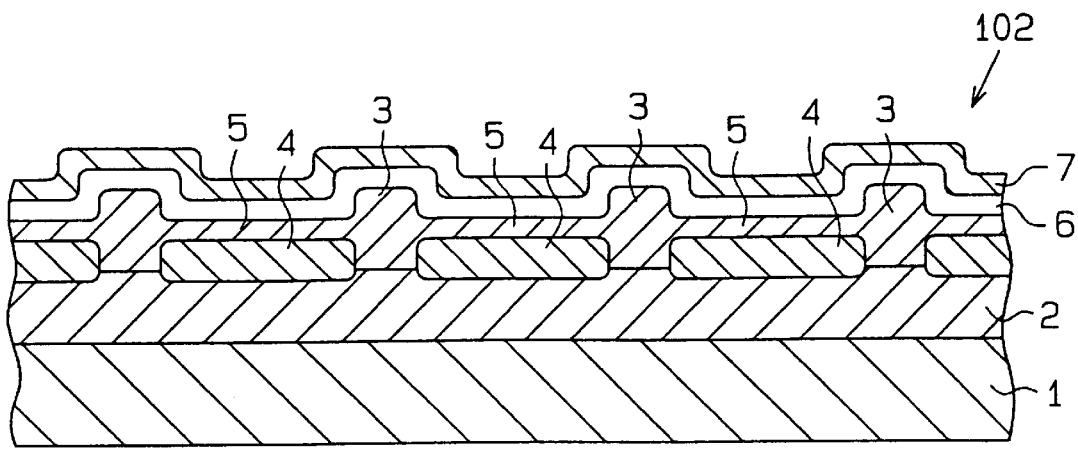
FIG. 3B is a cross-sectional view of the image sensing part along line 3B—3B of FIG. 2.
Figure 4A:
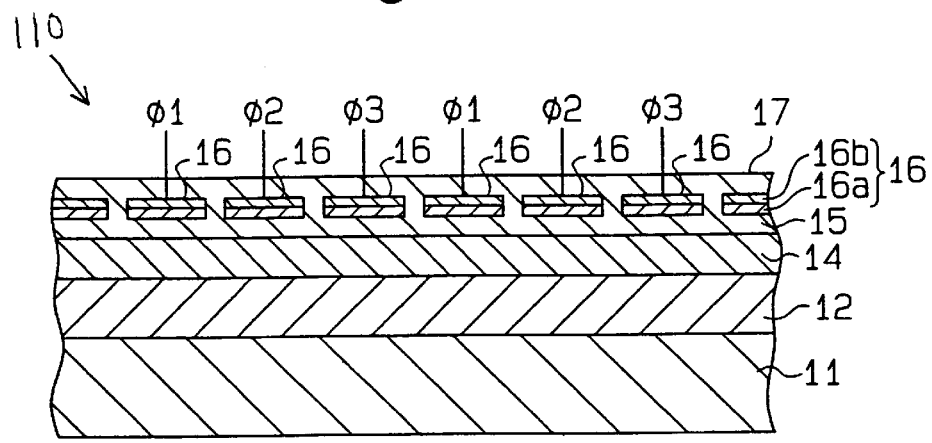
FIG. 4A is a cross-sectional view of an image sensing part of a solid-state image sensing device according to the present invention, which corresponds to FIG. 3A.
Figure 4B:
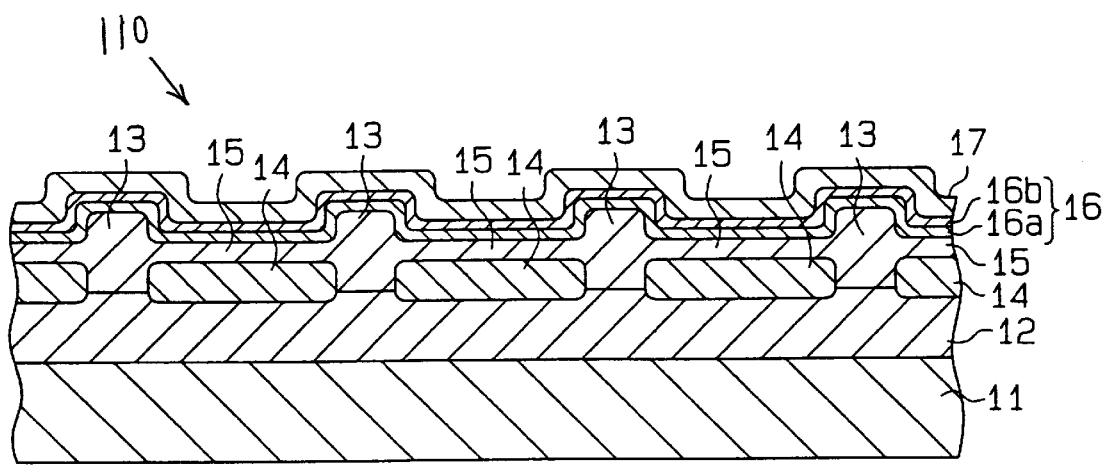
FIG. 4B is a cross-sectional view of the image sensing part of the solid-state image sensing device according to the present invention, which corresponds to FIG. 3B.

FIGS. 4A and 4B are cross-sectional views of a part of an image sensing part 110 of a solid-state image sensing device according to the present invention. FIGS. 4A and 4B correspond to FIGS. 3A and 3B, respectively.

A device area formed of a P-type diffusion region 12 is formed on a principal surface of an N-type silicon substrate 11. A plurality of thick channel isolation regions 13 extend in a vertical direction and are disposed substantially parallel with each other. The channel isolation regions 13 preferably comprise thick silicon dioxide films formed by selective oxidation. N-type diffusion regions 14 are disposed on the P-type diffusion region 12 between each of the channel isolation regions 13. The diffusion regions 14 form buried channels that are used as the transfer paths of the pixel data bits. The silicon substrate 11 operates as an overflow-drain that absorbs excessive charge generated in the channel region. The P-type diffusion region 12, the channel isolation regions 13 and the N-type diffusion regions 14 have the same structure as the P-type diffusion region 2, the channel isolation regions 3 and the N-type diffusion regions 4 of FIG. 3. The channel isolation regions 13 may be formed by heavily doped P-type areas or by the combination of thick oxide films and heavily doped P-type areas.

Gate insulation films 15, which preferably comprise silicon oxide films, are disposed integrally with the channel isolation regions 13 on the P-type diffusion regions 14. A plurality of transfer electrodes 16 are disposed substantially parallel with each other in a direction that is substantially perpendicular to the channel isolation region 13 and separated respectively by a constant distance on the gate insulation films 15 and the channel isolation region 13.

Figure 5:
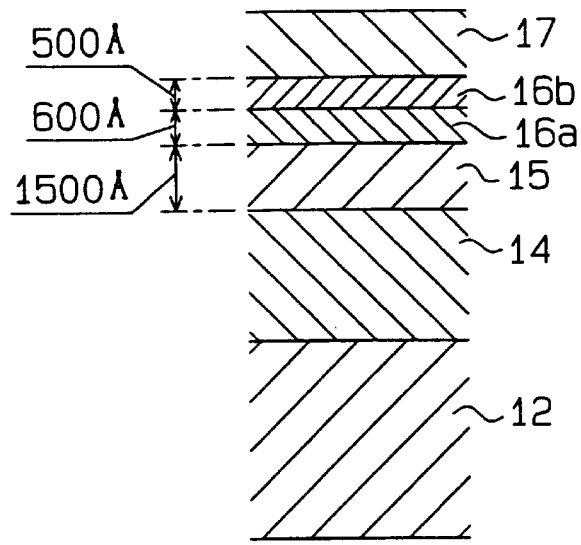
FIG. 5 is an enlarged cross-sectional view of the solid-state image sensing device according to the present invention.

Each transfer electrode 16 preferably includes a polycrystalline a silicon layer 16a and silicon nitride layer 16b. The silicon nitride layer 16b is preferably thinner than the polycrystalline silicon layer 16a. Each of the transfer electrodes 16, which comprises the layers 16a and 16b, is thinner than the gate insulation films 15. As shown in FIG. 5, the optimum thickness of each gate insulation film 15 is 1500 Å, the optimum thickness of each polycrystalline silicon layer 16a is 600 Å, and the optimum thickness of each silicon nitride layer 16b is 500 Å.

The preferable thickness range of the film 15 and the layers 16a, 16b are within ±10% of the optimum values. If the thickness is in the preferable range, the film 16 and the layers 16a, 16b have desired advantages.

An inter-layer insulation film 17 comprising silicon oxide is laminated on top of the silicon substrate 11 on which the transfer electrodes 16 are formed, thus covering the transfer electrodes 16. Power supply lines (not illustrated) are formed on the inter-layer insulation film 17 to apply transfer clocks φ1–φ3 to the transfer electrodes 16.

The refractive index of the silicon nitride layer 16b, which is located on the polycrystalline silicon layer 16a, is higher than that of silicon oxide forming the inter-layer insulation film 17. Therefore, light reaching through the silicon oxide is prevented from being reflected. Accordingly, the amount of light reaching the transfer electrodes 16 is increased. That is, a great amount of light reaches the channel region. As a result, the sensitivity of the light-receiving pixels is improved.

Figure 6:
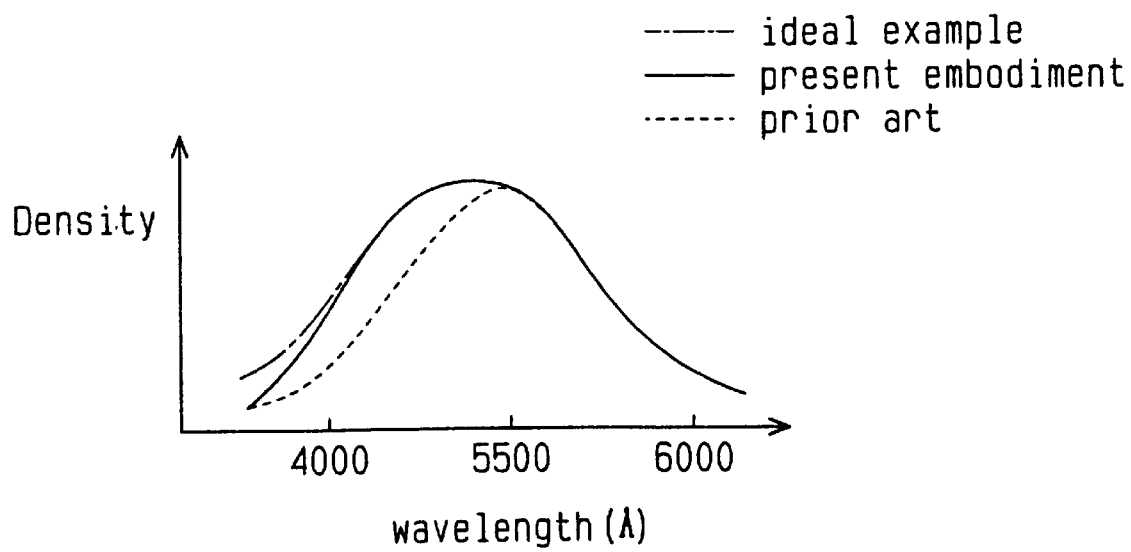
FIG. 6 is a graph of the spectral sensitivity characteristics of the solid-state image sensing device according to the present invention.

FIG. 6 is a graph showing the spectral sensitivity characteristics of solid-state image sensing devices. The graph is obtained by a simulation. A solid line shows a case in which the transfer electrode comprises a polycrystalline silicon layer and a silicon nitride layer (the illustrated embodiment). A dashed line shows a case in which the transfer electrode comprises only a polycrystalline silicon layer (the prior art). A long and short dashed line shows an example of an ideal image sensing part in which no light is reflected.

As shown in FIG. 6, the device of the illustrated embodiment has improved sensitivity in a range of shorter wavelength, between 4000 521 and 5500 Å, compared to the prior art device 100. Specifically, the device 110 of the illustrated embodiment has improved sensitivity for blue light. A device having no transfer electrode, or a device having a construction similar to that of a photodiode has nearly ideal spectral sensitivity characteristics.

FIGS. 7A to 7D are a series of cross-sectional views illustrating steps of a method of manufacturing the solid state image sensing device 110.

(a): First step

Figure 7A:
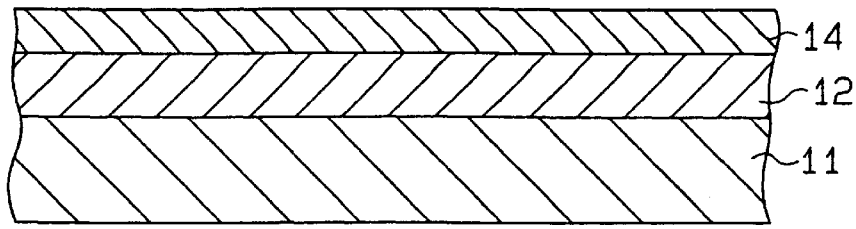
FIGS. 7A through 7D are a series of cross sections illustrating a method of manufacturing the solid state image sensing device according to the invention.

As shown in FIG. 7A, a P-type impurity such as boron is diffused on a surface area of an N-type silicon substrate 11 to form a device area of the P-type diffusion region 12. A selective oxidation process is used to grow a silicon oxide film in the surface of the P-type diffusion region 12, thus forming a plurality of channel isolation regions 13 (not shown), which extend vertically at a predetermined spacing therebetween. An N-type impurity such as phosphorus is implanted into regions located between the channel isolation regions 13 to form the N-type diffusion regions 14 which provide respective channel regions.

(b): Second step

Figure 7B:
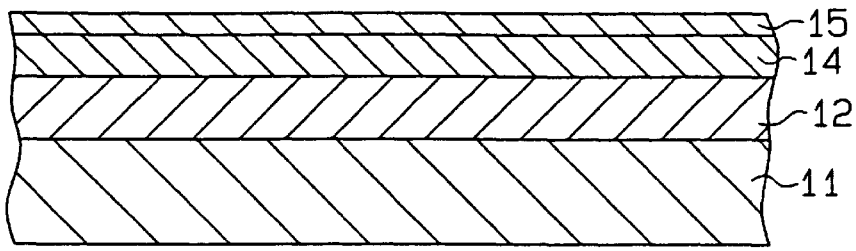

As shown in FIG. 7B, the surface of the silicon substrate 11 inclusive of the diffusion regions 14 is thermally oxidized to form gate insulation films 15, which grows to a thickness of 1500 Å. During the thermal oxidization, a silicon oxide film is also formed on the surface of the channel isolation region 13.

(c): Third step

Figure 7C:
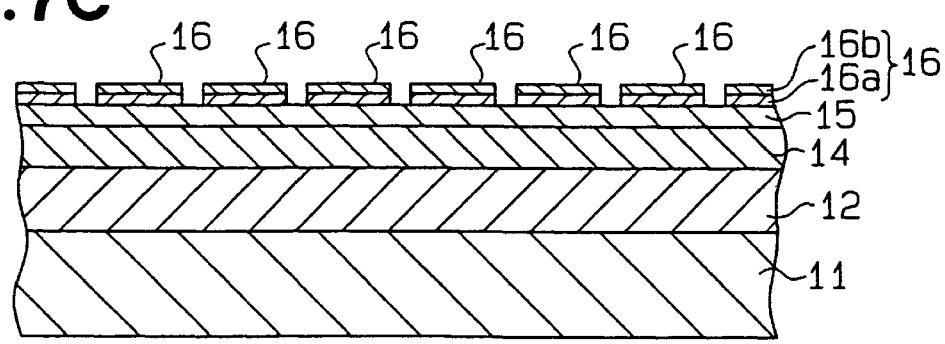

As shown in FIG. 7C, a CVD (chemical vapor deposition) process is used to deposit polycrystalline silicon (polysilicon) which has a thickness of about 600 Å. Subsequently, silicon nitride is deposited on the surface of the polysilicon such that the silicon nitride has a thickness of about 500 Å, thus forming the polycrystalline oxide layer 16a and the silicon nitride layer 16b. Both of the layers 16a, 16b are then patterned simultaneously into a given configuration which traverses the channel isolation regions 13, thus forming a plurality of transfer electrodes 16.

(d): Fourth step

Figure 7D:
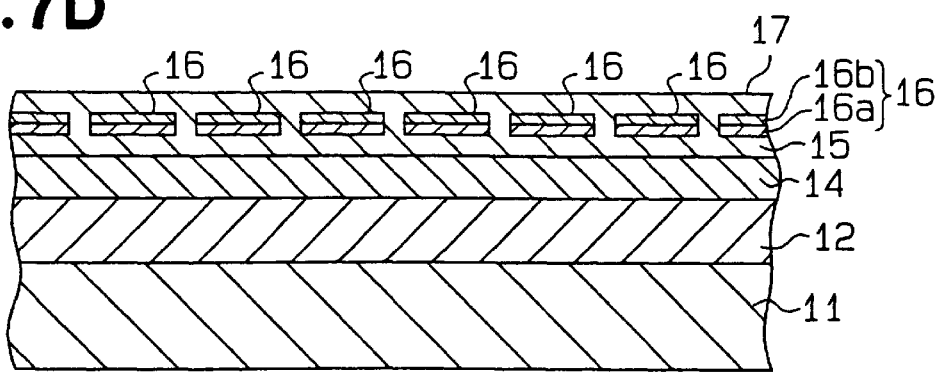

As shown in FIG. 7D, a CVD process is used to deposit silicon nitride, thus forming an inter-layer isolation film 17 on top of the plurality of transfer electrodes 16. Then, via holes (not shown) are formed at an end of the transfer electrodes 16, or in the inter-layer insulation film 17 at locations above the channel isolation regions 13. Then, power supply lines (not shown) are formed to connect the transfer electrode 16 thereto. This allows three phase transfer clocks φ1, φ2, φ3 to be applied to the transfer electrodes 15 from the power supply lines.

In the illustrated method, the silicon nitride layer 16b, the refractive index of which is higher than that of a silicon oxide layer, is formed on the polycrystalline silicone layer 16a. This construction suppresses light reflection at the interface between the silicon nitride layer 16b and the inter-layer insulation film 17. The polycrystalline silicon layer 16a and the silicon nitride layer 16b are continuously formed for forming the transfer electrode 16. Thereafter, the layers 16a and 16b are etched. Therefore, the transfer electrode 16 is manufactured by a procedure having only one added step for forming the silicon nitride layer 16b.

The present invention may be applied to a solid-state image sensing device comprising a two-layer structure in which the adjacent transfer electrodes 16 overlap each other. The transfer clock applied to the transfer electrodes is not restricted to be three-phases, but may be two, four or more phases.

Therefore, the present examples and embodiments are to be considered as illustrative and not restrictive and the invention is not to be limited to the details given herein, but may be modified within the scope and equivalence of the appended claims.

What is claimed is:

1. A solid state image sensing device comprising:

a semiconductor substrate having a plurality of channel regions extending in a first direction, the channel regions extending substantially parallel to each other with a predetermined spacing therebetween;

a gate insulation film located on a part of the semiconductor substrate that includes the channel regions; and a plurality of transfer electrodes formed on the gate insulation film, the transfer electrodes extending substantially parallel to each other in a second direction to intersect with the channel regions;

wherein each transfer electrode includes a polycrystalline silicon layer disposed on the gate insulating film and a silicon nitride layer, which is thinner than said polycrystalline silicon layer disposed on the polycrystalline silicon layer, and wherein each transfer electrode is thinner than the gate insulation film.

2. The solid state image sensing device of claim 1, wherein said silicon nitride layer has a thickness of about 500 Angstroms.

3. The solid state image sensing device of claim 2, wherein said polychrystalline silicon layer has a thickness of about 600 Angstroms.

4. The solid state image sensing device of claim 3, wherein said gate insulation film has a thickness of about 1500 Angstroms.

* * * * *